United States Patent

Scudiere et al.

[11] Patent Number: 6,110,606
[45] Date of Patent: *Aug. 29, 2000

[54] CRYOGEN PROTECTED SUPERCONDUCTING CERAMIC TAPE

[75] Inventors: John D. Scudiere, Bolton; David M. Buczek, Needham, both of Mass.

[73] Assignee: American Superconductor Corporation, Westborough, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/701,375

[22] Filed: Aug. 30, 1996

[51] Int. Cl.[7] .......................... C25D 11/02; C03C 27/02; B32B 12/00
[52] U.S. Cl. .......................... 428/629; 428/632; 428/674; 428/684; 428/930; 505/230; 505/236; 505/237; 505/238
[58] Field of Search .................. 428/629, 632, 428/674, 684, 930; 505/230, 236, 237, 238

[56] References Cited

U.S. PATENT DOCUMENTS

| | | | |
|---|---|---|---|
| 3,537,827 | 11/1970 | Benz et al. | 29/194 |
| 4,617,789 | 10/1986 | Borden | 57/6 |
| 4,990,490 | 2/1991 | Pathare et al. | 505/1 |
| 5,059,582 | 10/1991 | Chung | 505/1 |
| 5,116,809 | 5/1992 | Tsuno et al. | 505/1 |
| 5,121,869 | 6/1992 | Knudsen et al. | 228/4.1 |
| 5,200,390 | 4/1993 | Howng | 505/1 |
| 5,200,391 | 4/1993 | Fisher et al. | 505/1 |
| 5,232,908 | 8/1993 | Shiga et al. | 505/1 |
| 5,299,728 | 4/1994 | King et al. | 228/179.1 |
| 5,312,802 | 5/1994 | Hayashi et al. | 505/211 |
| 5,399,547 | 3/1995 | Negm et al. | 505/430 |
| 5,531,015 | 7/1996 | Manlief et al. | 29/599 |

OTHER PUBLICATIONS

C. King et al.; Evaluation of a Strengthening and Insulation System for High Temperature BSCCO–2223 Superconducting Tape; [1]GE Medical Systems, Florence, SC.

Primary Examiner—Paul Thibodeau
Assistant Examiner—Holly C. Rickman
Attorney, Agent, or Firm—Fish & Richardson P.C.

[57] ABSTRACT

A high performance superconducting ceramic article for use in a liquid cryogen bath is provided. It includes a superconducting ceramic tape having at least one surface vulnerable to cryogenic infiltration is sealed on each vulnerable surface to a non-porous metallic laminate, which also provides the desired support structure, in substantially impervious relation by a non-porous metallic bonding agent. This results in greater protection of the superconducting ceramic tape from cryogen infiltration, and permits greater thermal cycling of the superconductor during use without causing degradation of the tape's critical current carrying capacity.

14 Claims, 3 Drawing Sheets

CRYOGEN PROTECTED SUPERCONDUCTING CERAMIC TAPE

BACKGROUND OF THE INVENTION

The invention relates to superconducting ceramic tapes, and particularly to laminated superconducting ceramic tapes.

It is known to form superconducting ceramic conductors by laminating the superconductor tape to a support structure to improve the tape's tolerance to tensile and bending stresses. However, when an article containing superconductor tape is immersed in a liquid cryogen, any contact between the cryogen and the superconducting ceramic, whether at an exposed surface of the tape or through defects in the matrix surrounding the superconducting material, allows the liquid cryogen to enter the porous ceramic structure. When the article is quickly warmed, which is standard practice in the operation of superconducting systems, the liquid cryogen trapped in the interstices of the ceramic expands quickly, creating "balloons" in the matrix and damaging the intragrain bonds in the ceramic. This results in decreases in the mechanical strength and critical current carrying capacity of the article. Typically this is true even of laminated tapes, as the cryogen seeps into the gaps between the superconducting tape and the support structure. Thermal cycling, which is a necessity for the normal operation of many superconducting articles increases this effect. To address this issue, it has been known to "pot" certain superconducting articles, such as small coils with thick layers of epoxy to minimize the likelihood of contact between the liquid and the superconducting tape, or to use other forms of cooling, such as conduction cooling when the articles cannot reasonably be protected in this manner. However, for many applications, including transmission cables, transformers, and high field magnets, the preferred cooling method requires direct thermal contact of a liquid cryogen with the superconducting conductor. In these applications, conduction cooling is typically not adequate and applying a heavy epoxy coating is typically not feasible for a number of reasons which may include, for example, packing factor and flexibility requirements as well as the need to assure good heat transfer between the article and the liquid cryogen.

SUMMARY OF THE INVENTION

A high performance superconducting ceramic article for use in direct contact with a liquid cryogen bath is provided. It includes a superconducting ceramic tape having at least one surface vulnerable to cryogenic infiltration is sealed on each vulnerable surface to a non-porous metallic laminate, which also provides the desired support structure, in substantially impervious relation by a non-porous metallic bonding agent. This results in greater protection of the superconducting ceramic tape from cryogenic infiltration, provides a cooling path for the superconducting article during the cool-down portion of a thermal cycle, and permits greater thermal cycling of the superconductor during use without causing degradation of the tape's critical current carrying capacity. In some embodiments, it also improves the tape's tolerance to tensile and bending stresses.

By "non-porous" and "impervious" are meant substantially non-porous and substantially impervious to one or more of liquid helium, liquid nitrogen, liquid hydrogen and liquid argon at the operating temperatures and pressures for which the superconducting article is designed. In particular embodiments of the invention, the laminate is a tape formed from stainless steel, copper, copper alloys, or superalloys. In particular embodiments of the invention, the laminate has a coefficient of thermal expansion within about 50% greater or less than that of the superconducting ceramic tape. Solder is the preferred metallic bonding agent. A first vulnerable surface of the superconductor tape can be sealed to one laminate and a second vulnerable surface of the superconductor tape can be sealed to a second laminate.

According to another aspect of the invention, a cryogenically cooled assembly comprises a liquid cryogen and a vessel for containing it, and a superconducting article at least partially immersed in the liquid cryogen. The article includes a superconducting ceramic conductor in direct contact with the liquid cryogen which comprises a superconducting ceramic tape having at least one surface vulnerable to cryogen infiltration by the preselected liquid cryogen, and a non-porous laminate sealed to the vulnerable surface in substantially impervious relation. The assembly may further comprise refrigeration means for cooling the liquid cryogen. According to additional aspects of the invention, particular articles including a superconducting coil and a cable conductor are formed from the superconducting ceramic tape of the invention.

According to another aspect of the invention, an apparatus for laminating a superconducting ceramic tape to a laminate includes means for cleaning the superconducting ceramic tape, a laminator and a feed guide for guiding the superconducting ceramic tape and the laminate along a laminate process path into the laminator. In particular embodiments, the laminator includes a dryer/heater for heating the tape and the laminate during lamination to expand the tape and the laminate and minimize voids in the bonding agent. In particular embodiments, the laminator includes a solder wave that flushes out voids in the bonding agent and a guide dam to control the thickness of the solder layers.

According to another aspect of the invention, a method of laminating a superconducting ceramic tape includes cleaning the superconducting ceramic tape to provide an improved bonding surface, feeding the superconducting ceramic tape through a laminator, feeding a metallic laminate into the laminator, and laminating the superconducting ceramic tape to the laminate with a non-porous metallic bonding agent. Preferably, the thickness of the seal joint is in the range of about 0.0001" to about 0.001", and most preferably about 0.0002" to about 0.0006".

In particular embodiments of the method of the invention the tape and the laminate are heated during lamination to expand the tape and the laminate and minimize voids in the bonding agent. In some embodiments, a second laminate is fed into the laminator and the superconducting ceramic tape is laminated to the second laminate.

Advantages of the system may include one or more of following. The superconducting ceramic tape is not subject to cryogen infiltration though surface defects or exposed surfaces during use that would result in degradation of the tape's critical current carrying capacity.

BRIEF DESCRIPTION OF THE DRAWINGS

Other objects, features and advantages of the invention will be apparent from the following description taken together with the drawings in which.

DESCRIPTION OF THE PREFERRED EMBODIMENTS

Figure 1:
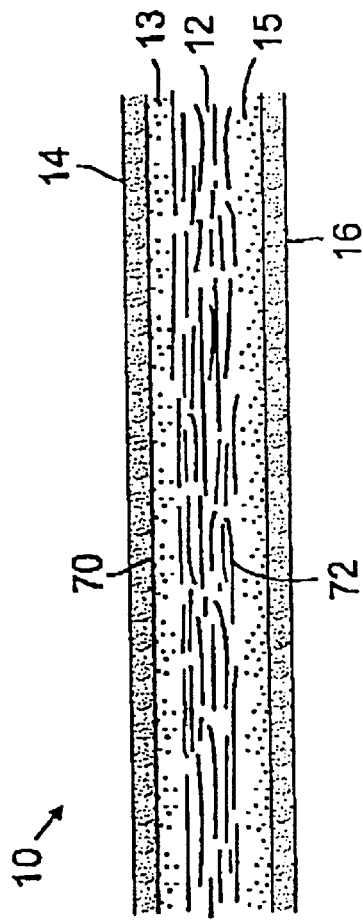
FIG. 1 shows a laminated superconducting ceramic tape.

Referring to FIG. 1, a laminated superconducting ceramic conductor 10 manufactured in accordance with the invention includes a superconducting ceramic tape 12 having surfaces 70 and 72 which are vulnerable to cryogenic infiltration by a selected liquid cryogen in which an article containing the conductor will be used. These are imperviously sealed to non-porous metallic laminates 14 and 16 by, for example, solder layers 13 and 15. Solder is the preferred metallic bonding agent, although others, including thoroughly wetted dispersions of metallic fibers or particles in an epoxy, may be used. The desired thickness of the solder layers of the laminated superconductor 10 is typically in the range of about 0.0001" to about 0.001", and preferably 0.0002" to about 0.0006".

The laminate material is selected to have a coefficient of thermal expansion within about 50% greater or less than that of the superconducting ceramic tape. This laminated superconductor structure can produce an initial amount of compressive stress on tape 12 when laminates 14, 16 are selected to have a significantly different coefficient of expansion than tape 12. The larger the disparity between the coefficients of expansion of the laminates and the tape, the greater strain the solder layers 13 and 15 are put under as it cools after lamination and the more likelihood of cryogen leakage which may be damaging to the superconducting tape.

Tape 12 of laminated superconductor 10 can typically have a width of about 0.02–1.0" or larger, and a thickness of about 0.001–0.040" or larger. The tapes may be made by any process for manufacturing superconducting tape, such as the well-known powder-in-tube and coated conductor processes. Typically, in highly aspected tapes made by the powder-in-tube process, the two broad faces of the tape will be vulnerable surfaces due to manufacturing defects, while the narrow faces of the tape will be substantially defect-free and impervious to cryogens. Depending on the particular geometry, all or only a portion of the surface of a coated conductor may constitute a vulnerable surface, although one-sided tapes are perhaps the most common. The invention may be practiced with any superconducting ceramic. Superconducting oxides are preferred, especially superconducting copper oxides of the bismuth, rare earth, thallium, lead, or mercury families. Typical superconducting ceramic materials include, for example, $(Pb,Bi)_2Sr_2Ca_2Cu_3O$ (BSCCO 2223), $(Pb,Bi)_2Sr_1Ca_1Cu_2O$ (BSCCO 2112), and $Y_1Ba_2Cu_3O_{7-\delta}$ (YBCO 123).

Metallic laminates 14, 16 are selected to provide thermal and electrical conductivity to permit cooling of the superconducting article and allow current transfer between the superconducting conductors in the article. The laminates are preferably stainless steel tapes (other metal tapes, for example, copper, copper alloy or superalloy tapes are also suitable) and must have a width comparable to that of tape 12. Preferably, their width is not more than 0.005" less than that of tape 12. If the width of laminates 14, 16 is more than 0.005" less than the width of tape 12, the superconducting portions along the edges of vulnerable surfaces 70 and 72 do not receive the full benefit of being protected by laminates 14, 16. Small differences in width do not matter, as the non-porous bonding agent typically flows enough beyond the surface of the laminate to provide coverage for them, but the width of the tape and the flow surface together preferably covers at least 98% of the vulnerable surface of the superconducting tape.

Laminates 14, 16 typically have a thickness of about 0.001–0.003" or larger, although thinner ones may be used. Thick laminates, greater than about 0.004–0.02", preferably about 0.006", may advantageously be used in high field magnet applications to support large hoop stresses and support additional thermal mass.

In particular embodiments, laminates 14, 16 have a high yield strength of about 200–800 MPa or larger. The laminated superconducting ceramic 10 has been seen to have increased performance as the ultimate tensile strength of laminates 14, 16 increases permitting higher stress levels to be applied to superconductor 10 without causing plastic deformation of the superconductor. Thin stainless steel laminates having a thickness of about 0.001" advantageously have a higher yield strength than thicker stainless steel laminates and also provide a thin packing factor.

Figure 2:
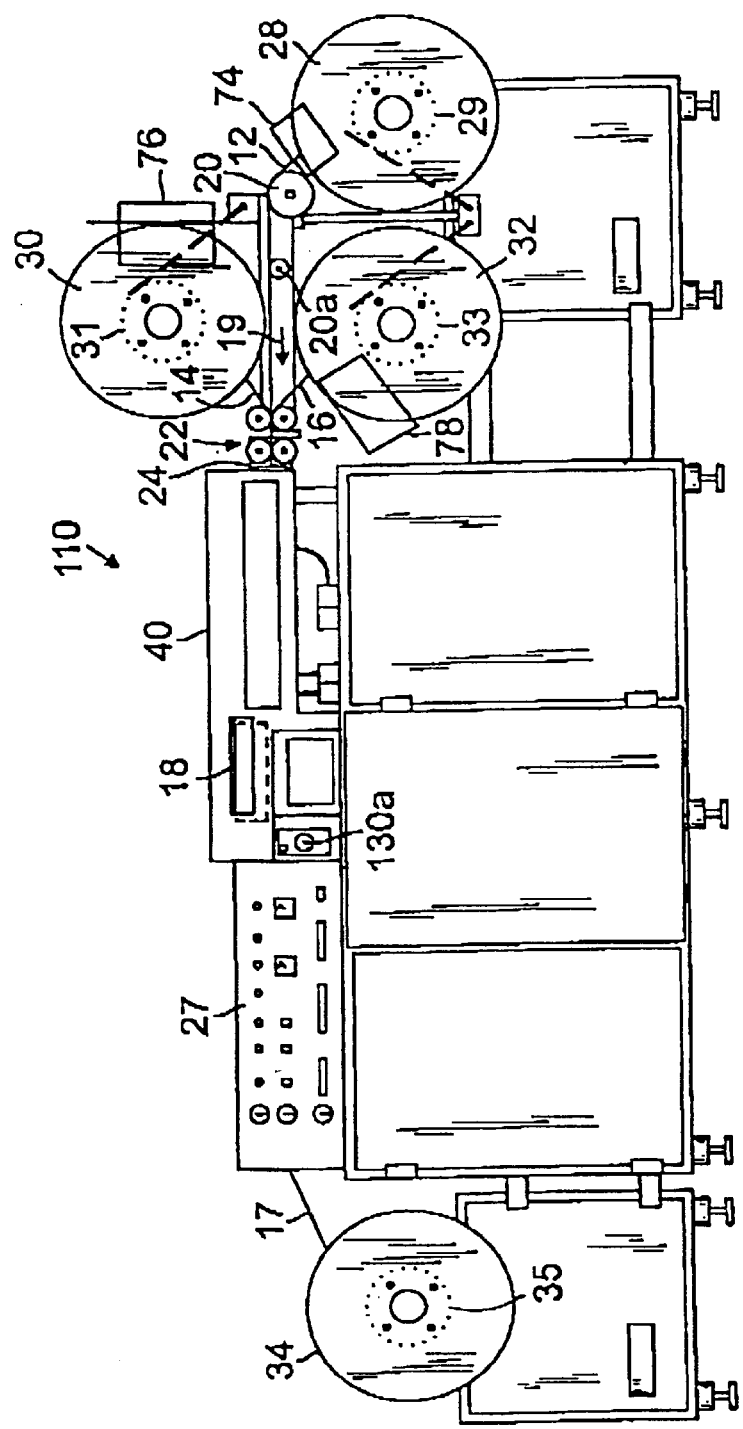
FIG. 2 is a schematic surface view of a laminating assembly in accordance with the invention.

Referring to FIG. 2, a laminating assembly 110 for laminating superconducting ceramic tape 12 between laminates 14 and 16 is shown. Laminating assembly 110 includes cleaning devices 74, 76, and 78, laminator 18, for example, a solder wave or solder bath, and a series of feed guides 20, 20a, 22, 24, and 26 (see FIG. 3) for guiding tape 12 and laminates 14, 16 into laminator 18. The cleaning devices may be, for example ultrasonic cleaning stations, flux stations, chemical deoxidation devices or mechanical scrubbers. Tape 12 preferably travels along a substantially straight laminate process path (arrow 19) to prevent degradation of the superconductor tape as it is fed through the feed guides, the cleaning devices, and the laminator. Laminating assembly 110 also includes an instrument panel 27 for input of user commands and displaying of system status.

Tape 12, prior to lamination, is stored on a payoff roll 28. Laminates 14, 16, prior to lamination, are stored on payoff rolls 30, 32, respectively. A take-up roll 34 on which the resulting laminated tape 17 is taken-up is driven by a motor 35 and pulls tape 12 and laminates 14, 16 through the feed guides and laminator. Payoff rolls 28, 30, 32 preferably include brakes 29, 31, 33, respectively, for independently controlling the tension in tape 12 and laminates 14, 16. The radius of curvature of tape 12 as it is fed from payoff roll 28 is maintained at greater than about 3 inches to prevent mechanical, and hence electrical, degradation of the superconductor tape. Laminates 14 and 16 can be tensioned during the laminating process, as taught, for example, in "Laminated Superconducting Ceramic Tape", U.S. patent application Ser. No. 08/705,811, filed Aug. 30, 1996 of John D. Scudiere, David M. Buczek, Gregory L. Snitchler and Paul J. Di Pietro, and filed the same day this application, the entire contents of which is hereby incorporated by reference.

Figure 3:
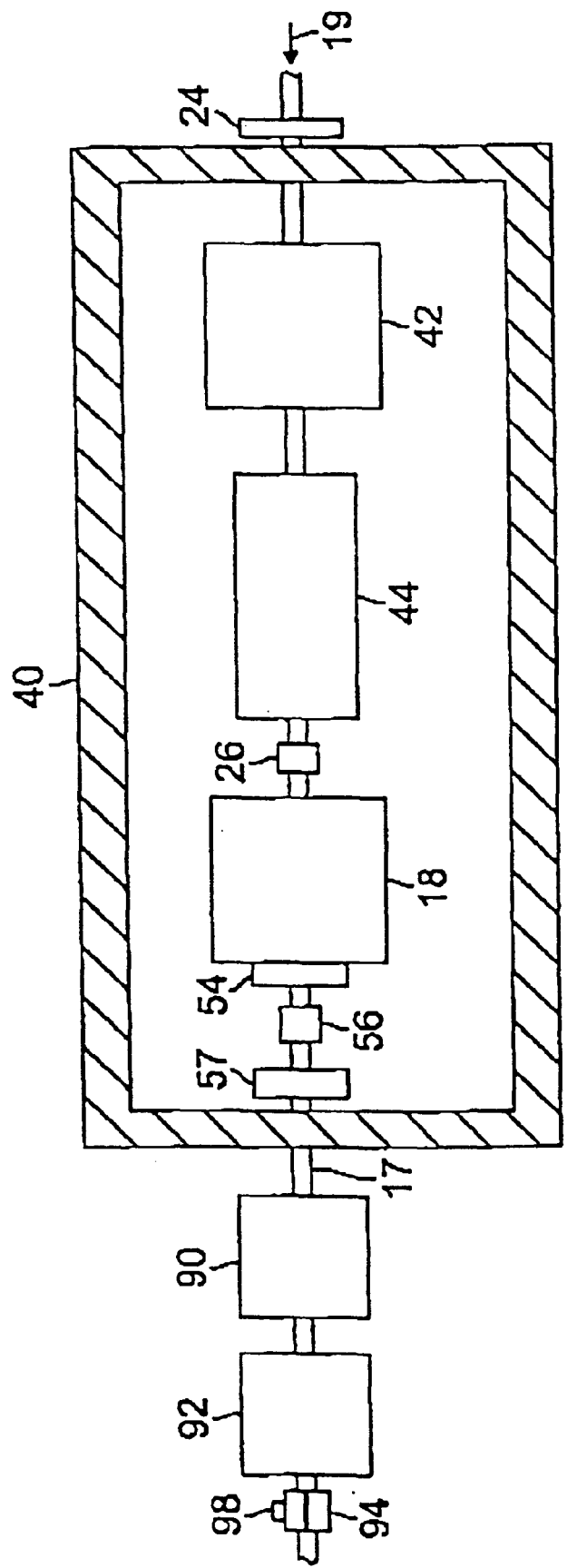
FIG. 3 is a top sectional view of a nitrogen enclosure of the laminating assembly of FIG. 1.

Referring to FIG. 3, laminating assembly 110 can include, for example, a nitrogen gas enclosure 40 housing laminator 18, a fluxer 42 located upstream of laminator 18, and a dryer/heater 44 located between fluxer 42 and laminator 18 to expand the tape and the laminate and minimize voids in the bonding agent. Preferably, the laminator includes a solder wave to minimize voids in the bonding agent. A guide dam 54 is used to control the thickness of the solder layers between laminates 14, 16 and tape 12. A cooler 56 blows air at, for example, 100° C., to remove excess solder from laminated tape 17 and cools the laminated tape to freeze the solder. An additional feed guide 57 is located downstream of cooler 56.

Located downstream of cooler 56 are a clean station 90 which sprays a cleaning fluid, for example, distilled water at about 70° C., over tape laminate 17 and a dryer 92 located downstream of clean station 90 including air jets at about 100° C. Guide rollers 94 are located downstream of dryer 92.

In the manufacturing process, the vulnerable surfaces of tape 12 are cleaned to improve their bonding surface to a level which will pass a standard solder wetability test such as ANSI-J-STD-002,-003. Preferably, laminates 14, 16 are cleaned by the same process and to the same degree, although the inventors have found that surface cryogen infiltration of the superconducting tape is primarily responsible for the formation of less than impervious seals. Then, tape 12 and laminates 14, 16 are heated to a soldering temperature. The flux may be applied by a flux soak or dip, a flux wipe, or a bubbler to insure that the vulnerable surface is continuously covered with flux. Fluxes which do not have adverse chemical reactions with the superconducting ceramic or the matrix, which are cleaned in water and which provide maximum wettability of the tape and laminate are preferred. For example, Alpha fluxes 856, 857 and 260HF may be used.

Tension on tape 12 is preferably maintained at relatively low levels during lamination, preferably corresponding to a strain of about 0.01% or less, to prevent tape degradation. The independently controlled brakes permit the laminates to be tensioned at a higher tension than tape 12 if desired during the lamination process. As the laminated tape 17 is cooled, the tape and laminates retract as they start to cool and the solder freezes, sealing the tape to the laminates.

Figure 4:
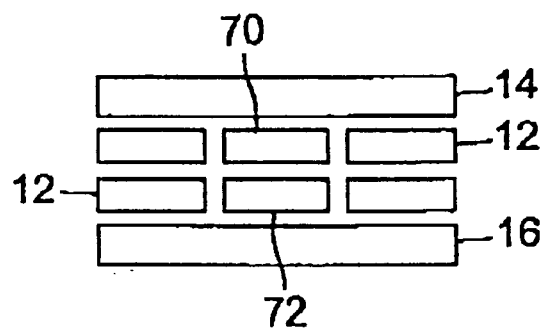
FIG. 4 is an end view of an additional embodiment of a superconducting ceramic.

Referring to FIG. 4, multiple stacks of superconducting ceramic tapes 12 can be laminated between laminates 14, 16. This configuration provides a structural aid for supporting the magnetic Lorentz forces seen when a coil is under hoop stress, and is also a potential cost reduction in coil fabrication.

Figure 5:
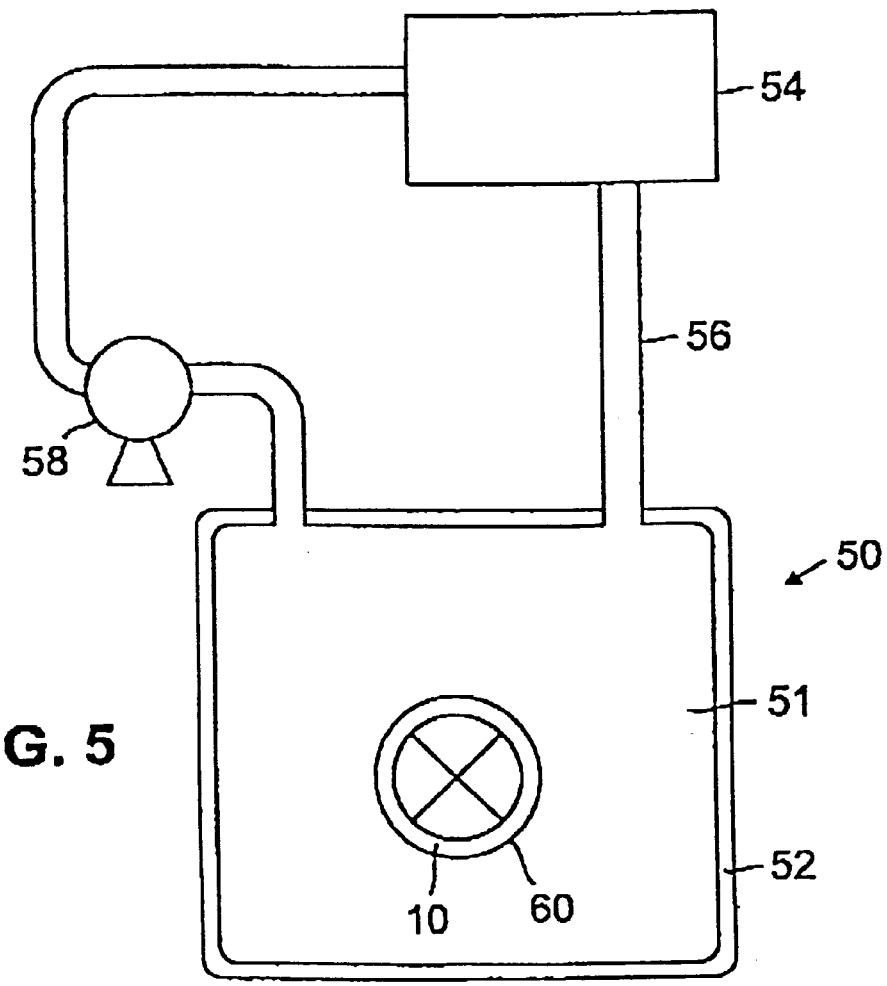
FIG. 5 is a schematic cross section of a liquid cryogen cooled assembly including a superconducting article in accordance with the invention.

FIG. 5 shows a system including a superconducting article such as a cable utilizing conductor made in accordance with the invention. The embodiment illustrated in FIG. 5 allows cryogen 51 to act a heat transfer medium in system 50. In particular, cryogen 51 is contained in vessel 52 which also contains a superconducting article 60 comprising conductor 10, which may be, for example, a superconducting cable viewed in cross section or a superconducting magnet coil. Superconducting article 60 is at least partially immersed in the liquid cryogen with the conductor 10 in direct contact with the liquid cryogens. The temperature of cryogen 51 is maintained within a desired range by circulating cryogen 51 through refrigeration unit 54 and circulating pump 58 in line 56. While not to be construed as limiting, the liquid cryogen could be, for example, liquid nitrogen, liquid helium, or liquid hydrogen. As further shown in FIG. 5, the temperature of the liquid cryogen in line 56 is maintained by refrigeration unit 54. The amount of material in article 60 determines the load on the unit 54, and thus the operating cost of the assembly. By using the non-porous laminates both as support structures and for protection against cryogen infiltration of the superconductor, the thickness of the matrix material in the superconducting tape can typically be substantially reduced. Reducing the thermal mass of material used will also reduce the operating cost of the assembly. This represents a double cost savings, as many tape manufacturing processes require expensive noble metal matrix materials, and cooling costs may also be reduced. This a particularly significant consideration for long length cables. However, it can also be a significant consideration for any application that is placed in a pool-boiling liquid cryogen environment where the article is directly cooled by the liquid cryogen.

Other embodiments are within the following claims.

For example, if in use, a superconductor tape is only to be exposed to bending strains in one direction, laminate can be soldered to only one surface of the tape to gain the advantage of withstanding higher applied strain while maintaining critical current carrying capacity. Laminating to one surface of the superconducting ceramic tape places that surface under compression while the opposite surface of the tape is placed under tension. In use, the tape is bent such that the surface under compression is tensioned. Additionally, laminates of different thicknesses can be sealed to either surface of tape 12 to provide a similar result. Laminated superconductors and methods of manufacture thereof are taught in "Improved Structure for Laminated Superconducting Ceramic Composite Conductors and Method of Manufacture", U.S. patent application Ser. No. 08/701,333, filed Aug. 30, 1996 of Bruce B. Gamble, Gilbert N. Riley, Jr., John D. Scudiere, Michael D. Manlief, David M. Buczek and Gregory L. Snitchler, and filed the same day as this application, the entire contents of which is hereby incorporated by reference.

Depending on the dimensions of the superconducting ceramic tape and the laminates, the difference in thermal expansion between the tape and the laminates, and porosity of the laminates and bonding agent, the superconducting ceramic can maintain about 90%, preferably about 95% or greater, of its original critical current capacity under repeated thermal cycling, so that, in other words, its performance is not degraded by more than 10% and preferably more than 5%. Current capacity retention of this order or greater has been observed over as many as 40 thermal cycles.

Additions, subtractions and other modifications of the illustrated embodiments of the invention will be apparent to those practiced in the art and are within the scope of the following claims.

What is claimed is:

1. A superconducting ceramic conductor for use in a preselected liquid cryogen, comprising:
   a superconducting ceramic tape having at least one surface vulnerable to cryogen infiltration by the preselected liquid cryogen, and
   a non-porous metallic laminate comprising a metallic bonding agent and a metallic tape disposed thereon sealed to the vulnerable surface by the metallic bonding agent to substantially prevent cryogen infiltration of said vulnerable surface, wherein the metallic bonding agent has a thickness in the range of 0.0002" to about 0.0006".

2. The superconducting ceramic conductor of claim 1 wherein the non-porous laminate has a coefficient of thermal expansion within about 50% greater or lesser than that of the superconducting ceramic tape.

3. The superconducting ceramic conductor of claim 1 wherein the non-porous laminate also provides a support structure for the superconducting ceramic tape.

4. The superconducting ceramic conductor of claim 1 wherein the non-porous laminate has a width comparable to that of the superconducting tape.

5. The superconducting ceramic conductor of claim 4 wherein the non-porous laminate comprises a tape formed from one of stainless steel, copper, copper alloys, and superalloys.

6. The superconducting ceramic of claim 1 wherein the bonding agent comprises one of solder or metal filled epoxy.

7. The superconducting ceramic of claim 1 wherein the non-porous bonding agent flows beyond the surface of the laminate to form a flow surface covering a part of said vulnerable surface, and the width of the tape and the flow surface together cover at least 98% of the vulnerable surface of said superconducting tape.

8. The superconducting ceramic conductor of claim 4 wherein the non-porous laminate has a width which is not more than 0.005" less than that of the superconducting tape.

9. The superconducting ceramic conductor of claim 1 further comprising a second non-porous metallic laminate comprising a metallic bonding agent and a metallic tape disposed thereon, the superconducting ceramic tape having first and second vulnerable surfaces, the first vulnerable surface being sealed by the metallic bonding agent to one of the non-porous metallic laminates and the second vulnerable surface being sealed by the metallic bonding agent to the other of the non-porous metallic laminates.

10. A superconducting cable, comprising a superconducting ceramic conductor according to claim 1.

11. A superconducting coil, comprising a superconducting ceramic conductor according to claim 1.

12. A superconducting ceramic conductor for use in a preselected liquid cryogen, comprising:
- a superconducting ceramic tape having at least one surface vulnerable to cryogen infiltration by the preselected liquid cryogen, and
- a non-porous metallic laminate comprising a metallic bonding agent and a metallic tape disposed thereon sealed to the vulnerable surface by the metallic bonding agent to substantially prevent cryogen infiltration of the surface such that the superconducting ceramic conductor can withstand thermal cycling without degrading the current carrying capability of the superconducting ceramic tape by more than 10%, and wherein the metallic bonding agent has a thickness in the range of 0.0002" to about 0.0006".

13. A cryogenically cooled assembly comprising:
- a vessel for containing a liquid cryogen,
- a liquid cryogen,
- a superconducting article at least partially immersed in the liquid cryogen, the article comprising a superconducting ceramic conductor in direct contact with the liquid cryogen which comprises
  - a superconducting ceramic tape having at least one surface vulnerable to cryogen infiltration by the liquid cryogen, and
  - a non-porous metallic laminate comprising a metallic bonding agent and a metallic tape disposed thereon sealed to the vulnerable surface by the metallic bonding agent to substantially prevent cryogen infiltration of the surface, wherein the metallic bonding agent has a thickness in the range of 0.0002" to about 0.0006".

14. The assembly according to claim 13 further comprising refrigeration means for cooling the liquid cryogen.

* * * * *